United States Patent [19]

Holland et al.

[11] Patent Number: 4,748,134
[45] Date of Patent: May 31, 1988

[54] ISOLATION PROCESS FOR SEMICONDUCTOR DEVICES

[75] Inventors: Orin W. Holland, Oak Ridge, Tenn.; John R. Alvis, Austin, Tex.

[73] Assignee: Motorola, Inc., Schaumburg, Ill.

[21] Appl. No.: 53,919

[22] Filed: May 26, 1987

[51] Int. Cl.[4] .................. H01L 21/265; H01L 17/00
[52] U.S. Cl. ...................................... 437/062; 437/11; 437/24; 437/69; 437/70
[58] Field of Search .................. 437/11, 24, 69, 70, 437/62

[56] References Cited

U.S. PATENT DOCUMENTS

| | | | |
|---|---|---|---|
| 4,098,618 | 7/1978 | Crowder | 437/69 |
| 4,133,704 | 1/1979 | MacIver et al. | 437/11 |
| 4,144,100 | 3/1979 | MacIver et al. | 437/24 |
| 4,277,882 | 7/1981 | Crossley | 437/29 |
| 4,551,910 | 11/1985 | Patterson | 437/69 |

OTHER PUBLICATIONS

"Effect on Fluorine Implantation on the Kinetics of Dry Oxidation of Silicon", J. Appl. Phys. 60 (3), Aug. 1, 1986, pp. 985–990.

"Donor Generation in Monocrystalline Silicon by Halogen Implantation", Solid State Electronics, vol. 26, No. 3, pp. 241–246, 1983.

"Dopant Dependence of the Oxidation Rate of Ion Implanted Silicon Radiation Effects", vol. 47, pp. 203–210, 1980.

"Kinetics of the Thermal Oxidation of Silicon in $O_2$/HCl Mixtures", J. Electrochem Soc., vol. 124, No. 5, May 1977, pp. 735–739.

"Selective Oxidation Technologies for High Density MOS", IEEE Electron Device Letters, EDL-2, No. 10, Oct. 1981, pp. 244–247.

"Electrical Properties of MOS Devices Made with SILO Technology", IEDM $8_2$, pp. 220–222.

Primary Examiner—Upendra Roy
Attorney, Agent, or Firm—John A. Fisher; Jeffrey Van Myers

[57] ABSTRACT

An improved process is disclosed for forming the field oxide which provides isolation between adjacent devices in an integrated circuit. In one embodiment of the invention the improvement includes implanting halogen ions, and preferably chlorine ions, into the selected regions of a semiconductor substrate where field oxide is to be formed. The halogen ions are implanted before the field oxide is thermally grown and result in a localized enhancement of the oxide growth rate in the vertical direction compared to the lateral direction. For a given oxidation cycle, the halogen implant results in the growth of a thicker oxide with minimum lateral encroachment.

13 Claims, 2 Drawing Sheets

ISOLATION PROCESS FOR SEMICONDUCTOR DEVICES

RELATED APPLICATION

This application is related to commonly assigned copending application Ser. No. 053,917 filed May 26, 1987.

BACKGROUND OF THE INVENTION

This invention relates generally to an improved process for anisotropically increasing the growth rate of thermal oxide, and more specifically to improved methods for isolating between semiconductor devices.

In the formation of semiconductor devices, and specifically in the fabrication of semiconductor integrated circuits, an oxide layer, usually called a "field oxide", is used to isolate between adjacent devices. This is especially true with insulated gate field effect transistor circuits (MOS circuits) but is true of bipolar and other circuits as well.

Field oxide is usually formed by a process in which an oxidation resistant material such as silicon nitride or a combination of silicon nitride with silicon oxide or other materials is formed on a semiconductor substrate overlying active device regions where transistors or other devices are to be formed. The substrate is then heated in an oxidizing ambient to grow a thermal oxide on those portions of the substrate not protected by the oxidation resistant material. The nature of thermal oxide formation causes the oxide so formed to be recessed into the silicon substrate as silicon is incorporated into the silicon oxide.

There are a number of problems associated with the use of conventional process for the formation of the localized silicon oxide isolation. These problems are especially significant with newer circuits which utilize an ever increasing number of devices and in which the devices are of ever decreasing size, both in surface area and depth. To produce a thermal oxide of sufficient thickness to provide the desired electrical isolation between devices requires a significant amount of processing at an elevated temperature. Long times at elevated temperatures are inconsistent with shallow devices and tend to cause crystalline defects in the semiconductor substrate. In addition, as thermal oxides grow in thickness, they also grow laterally. Thick oxides thus use a considerable amount of lateral space and accordingly require an increase in the size of the circuit chip. This is especially true when the circuit involves a large number of devices and thus a large number of isolation regions between the devices. Still further, as the thermal oxide grows and expands laterally, the oxide encroaches under the edge of the oxidation resistant material, causing a lifting of the edge of the oxidation resistant material and forming what is known in the semiconductor industry as a "bird's beak".

Because of the foregoing and other problems associated with the conventional formation of isolating thermal oxides, there was a need for an improved process which would increase the vertical growth rate of thermal oxides, and would especially increase the vertical growth rate relative to the lateral growth rate.

Accordingly, it is an object of this invention to provide an improved process for the formation of oxide isolation between devices.

It is another object of this invention to provide an improved process for the anisotropic oxidation of silicon.

BRIEF SUMMARY OF INVENTION

The foregoing and other objects and advantages of the invention are achieved through an improved process wherein oxidation rate is anisotropically increased by the selective and localized implantation of halogen ions prior to a thermal oxide growth. In accordance with one embodiment of the invention, a silicon substrate is selectively masked with silicon nitride, chlorine ions are implanted into the unmasked regions of the substrate, and the substrate is subsequently oxidized using the silicon nitride as an oxidation mask. The presence of the chlorine ions in localized regions causes an enhancement of the oxide growth rate, but the localized nature of the implant causes the growth rate enhancement to be limited in lateral extent.

DETAILED DESCRIPTION OF PREFERRED EMBODIMENTS

FIGS. 1-4 illustrate process steps in accordance with one embodiment of the invention. In this embodiment, localized oxide regions, recessed into the surface of the semiconductor substrate, are formed, for example, for isolation between semiconductor devices. Such localized oxide or "field oxide" is often used for isolation between adjacent devices in an MOS integrated circuit although the oxide may also be used in bipolar circuits, within a discrete device, or in other similar applications.

Figure 1:
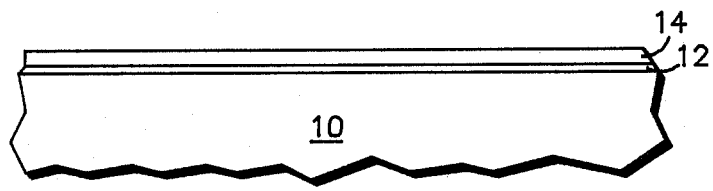
FIGS. 1-4 illustrate, in cross-section, process steps in accordance with one embodiment of the invention wherein an isolating oxide is formed between device regions.

FIG. 1 illustrates, in cross-section, a portion of a semiconductor substrate 10 in which it is desired to form a plurality of active regions which are isolated at the substrate surface by a localized oxide. Overlying the surface of substrate 10 is an oxidation resistant layer of material. In the illustrative embodiment the oxidation resistant layer includes a thin layer 12 of silicon dioxide and an overlying layer 14 of silicon nitride. Alternatively, the oxidation resistant material can be a layer of silicon nitride alone, various layers of oxide and nitride, silicon oxynitride, aluminum oxide, or the like.

Figure 2:
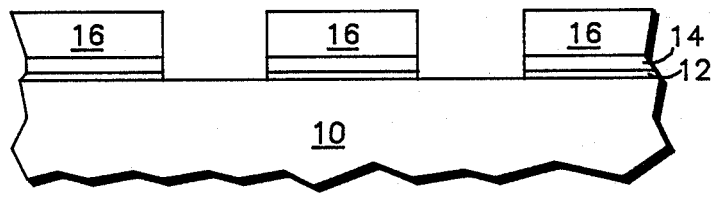

The process continues by patterning the oxidation resistant material to leave that material overlying the active device portions of the substrate. As illustrated in FIG. 2, the patterning of the oxidation resistant material is accomplished by applying and photolithographically patterning a layer of photoresist to form photoresist regions 16 overlying what will become the active regions of the device to be formed. FIG. 2 shows three such regions, although the number, location, and shape of these regions will depend upon the device being fabricated. Patterned photoresist 16 is used in conventional manner to pattern the underlying layers of silicon nitride and silicon oxide. The patterning of the oxidation resistant material is done in conventional manner and is not critical to the practice of the invention. The patterning exposes selected portions of the substrate surface. Not all of the layers must be removed; oxide layer 12, for example, may be left on the surface. In this context, "exposes" is meant to encompass either option and is not limited to removing all layers to obtain a bare surface.

Figure 3:
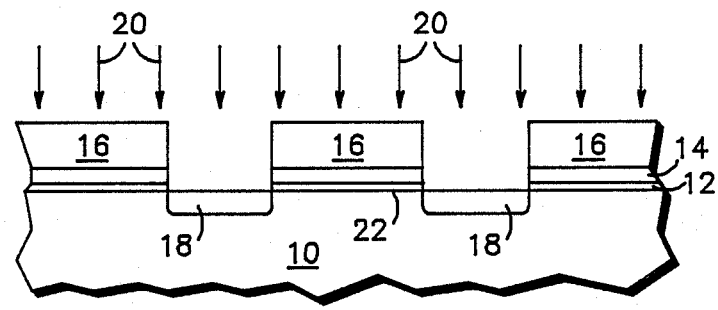

In accordance with the invention, halogen ions, and preferably chlorine ions, are implanted selectively into the surface of substrate 10 as illustrated in FIG. 3. The ions are selectively implanted into the substrate surface using the patterned oxidation resistant material 12,14 and preferably also the patterned photoresist 16 as an ion implantation mask. Implanted regions 18 which are doped with the halogen ion are formed at the substrate surface in those locations where field oxide is to be formed. The implantation of ions, as illustrated by arrows 20, is an anisotropic process so that the location of the ions in the substrate is limited in lateral extent by the masking layers 12,14,16. In this and the following discussion the terms "lateral" and "vertical" are referenced to the major surface 22 of substrate 10 and represent directions parallel and perpendicular thereto, respectively. Because of the anisotropic nature of the ion implantation process, implanted regions 18 are aligned with the openings in the implant mask with only minor extension (due to scattering and the like) of ions laterally underneath the masking layer.

Figure 4:
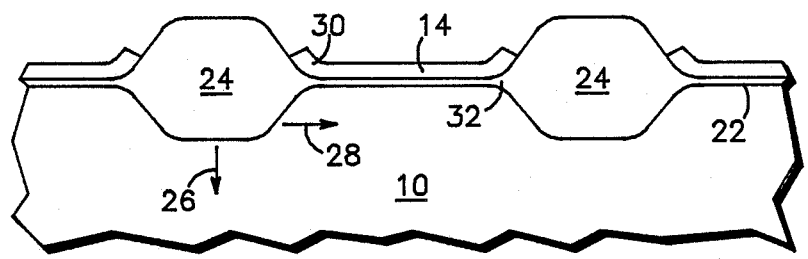

After removing photoresist layer 16, the exposed portions of substrate 10 are thermally oxidized to grow localized field oxide regions 24 as illustrated in FIG. 4. As is well known, the nature of the oxidation process causes field oxide 24 to be partially recessed below the original surface 22. The localized implantation of halogen ions into the surface of substrate 10 causes the oxidation rate in the presence of those halogen ions to markedly increase over the oxidation rate in the absence of such halogen ions. An important result of the process in accordance with the invention is the increase in the oxidation rate in the vertical direction compared to the lateral direction. Conventional oxidation is an isotropic process. Through practice of the process in accordance with the invention, the oxidation process becomes anisotropic with the vertical growth rate in the direction illustrated by arrow 26 exceeding the lateral growth rate in the direction indicated by arrow 28. The anisotropic nature of the oxidation process apparently results from the localized implantation of the halogen ions; the oxidation rate is increased only in those regions which are doped with the halogen ions, and the implantion process itself is anistropic.

The oxidation of substrate 10 to form field oxide regions 24 causes the oxide to extend into the surface laterally as well as vertically. The lateral growth of oxide 24 causes the well known upward bending 30 of nitride layer 14 with the consequent formation of bird's beak 32. The lateral expansion of the field oxide and the formation of the bird's beak are deleterious because the lateral encroachment reduces the area of the active region, thus requiring an increase in the size of the integrated circuit chip. By increasing the vertical growth rate relative to the lateral growth rate, a field oxide of the desired and necessary thickness is achieved with a reduced width and thus reduced encroachment into the active area. The increased oxidation rate also reduces the oxidation time required to achieve the necessary thickness and thus reduces the amount of time the device structure is exposed to a high temperature.

The structure obtained by a process in accordance with the invention, as illustrated in FIG. 4, is then processed in conventional manner (not shown) to complete the intended semiconductor device. For example, the oxidation masking layer is removed and a MOS transistor is fabricated in each of the active regions. The individual MOS transistors are electrically isolated by the thick field oxide 24.

In other semiconductor devices the starting substrate may also be processed to provide additional doping beneath and aligned with the field oxide, to provide epitaxial layers either with or without buried layers, and the like. For the fabrication of CMOS devices for example, the starting substrate may include both N-type and P-type surface regions.

The following non-limiting examples serve to further illustrate the invention and to disclose the best modes contemplated by the inventors for practice of the invention.

EXAMPLE 1

A number of N-type silicon wafers were oxidized to form a thermal oxide having a thickness of about 20–25 nanometers. The wafers were divided into four groups, and in each of the first three groups a portion of the surface was masked with photoresist. Wafers from each of the first three groups received graded energy implants as follows. Group 1 received 3 chlorine implants of $1 \times 10^{16}$ cm$^{-2}$ at 160 kev, $4.7 \times 10^{15}$ cm$^{-2}$ at 65 keV and $1.8 \times 10^{15}$ cm$^{-2}$ at 20 kev. The second group received three fluorine implants of $1 \times 10^{16}$ cm$^{-2}$ at 160 kev, $5.65 \times 10^{15}$ cm$^{-2}$ at 80 kev, and $2.2 \times 10^{15}$ cm$^{-2}$. The third group received three oxygen implants at $1 \times 10^{16}$ cm$^{-2}$ at 160 kev, $6.4 \times 10^{15}$ cm$^{-2}$ at 85 kev, and $3.5 \times 10^{15}$ cm$^{-2}$ at 40 kev. The fourth group received no implant. The patterned photoresist served as an ion implant mask so that the surface of each wafer was divided into an implanted portion and a non-implanted portion. The photoresist was then removed and the wafers were oxidized for five hours at 900° C. in a steam ambient. The oxide thickness was measured on the implanted and unimplanted portions of each wafer and the oxide thickness in the two regions was compared. The oxide thickness in the unimplanted regions was found to be about 490 nanometers; the oxide thickness in the implanted regions was found to depend on the implant species. The results of the oxide thickness comparision is summarized in the table below. The column labeled "Oxide Enhancement" is the ratio of the thickness of oxide in the implanted region compared to the thickness of the oxide in the unimplanted region. The results indicate that the implantation of chlorine under these conditions increases the oxide thickness by a ratio of 1.56. Little or no change in oxide thickness is observed for wafers implanted with fluorine or oxygen.

| Ion | Oxide Enhancement |
| --- | --- |
| Chlorine | 1.56 |
| Fluorine | 1.01 |
| Oxygen | 1.01 |
| No Implant | None |

EXAMPLE 2

Wafers were prepared in the same manner as for Example 1, but the wafers were oxidized for 90 minutes at 1000° C. in a steam ambient. The wafers were analyzed as above and the results are presented in the following table. For oxidation at 1000° C. the oxide thickness on wafers which received a chlorine implant increased by a ratio of 1.54. A slight increase in thickness was found on wafers implanted with fluorine. Only a negligable increase in thickness was found on wafers implanted with oxygen.

| Ion | Oxide Enhancement |
|---|---|
| Chlorine | 1.54 |
| Fluorine | 1.05 |
| Oxygen | 1.01 |
| No Implant | None |

EXAMPLE 3

P-type silicon wafers were oxidized to form an oxide layer of 20–25 nanometers. Each wafer was then masked with patterned photoresist to form masked and unmasked regions on the wafer surface. The wafers were then divided into groups which each received a different chlorine ion implant as follows:

Group 1: $1.0 \times 10^{16}$ cm$^{-2}$ at 160 kev, $4.7 \times 10^{15}$ cm$^{-2}$ at 65 kev, and $1.8 \times 10^{15}$ cm$^{-2}$ at 20 kev.
Group 2: $5.0 \times 10^{15}$ cm$^{-2}$ at 160 kev, $2.3 \times 10^{15}$ cm$^{-2}$ at 65 kev, and $0.9 \times 10^{15}$ cm$^{-2}$ at 20 kev.
Group 3: $2.5 \times 10^{15}$ cm$^{-2}$ at 160 kev, $1.2 \times 10^{15}$ cm$^{-2}$ at 65 kev, and $4.5 \times 10^{14}$ cm$^{-2}$ at 20 kev.
Group 4: $2.5 \times 10^{15}$ cm$^{-2}$ at 160 kev.
Group 5: $5.0 \times 10^{15}$ cm$^{-2}$ at 160 kev.
Group 6: $1.0 \times 10^{16}$ cm$^{-2}$ at 160 kev.
Group 7: $2,5 \times 10^{15}$ cm$^{-2}$ at 65 kev.
Group 8: $5.0 \times 10^{15}$ cm$^{-2}$ at 65 kev.
Group 9: $1.0 \times 10^{16}$ cm$^{-2}$ at 65 kev.
Group 10: $2.5 \times 10^{15}$ cm$^{-2}$ at 20 kev.
Group 11: $5.0 \times 10^{15}$ cm$^{-2}$ at 20 kev.
Group 12: $1.0 \times 10^{16}$ cm$^{-2}$ at 20 kev.

Each group was then further subdivided with the subdivisions being oxidized for 720 minutes at 830° C. in steam, 180 minutes at 900° C. in steam, 66 minutes at 1000° C. in steam, or 23 minutes at 1000° C. in steam, respectively. After the oxidation, the oxide on each wafer was measured and a comparison was made between the oxide grown on the implanted portion of the wafer compared to the oxide grown on the unimplanted portion of the wafer. The results are summarized in the table below in which the results are given as the ratio of the oxide thickness in the implanted portion compared to the oxide thickness in the unimplanted portion.

| Group | 830° C. | 900° C. | 66 mins 1000° C. | 23 mins. 1000° C. |
|---|---|---|---|---|
| 1 | 1.49 | 1.71 | 1.58 | 1.95 |
| 2 | 1.36 | 1.42 | 1.42 | 1.52 |
| 3 | 1.25 | 1.23 | 1.21 | 1.29 |
| 4 | 1.22 | 1.22 | 1.14 | 1.16 |
| 5 | 1.32 | 1.32 | 1.29 | 1.29 |
| 6 | 1.42 | 1.42 | 1.34 | 1.37 |
| 7 | 1.09 | 1.09 | 1.08 | 1.14 |
| 8 | 1.17 | 1.17 | 1.20 | 1.36 |
| 9 | 1.26 | 1.26 | 1.27 | 1.58 |
| 10 | 1.02 | 1.02 | 1.02 | 1.05 |
| 11 | 1.03 | 1.03 | 1.04 | 1.10 |
| 12 | 1.10 | 1.10 | 1.06 | 1.15 |

Enhancement in the oxidation rate by chlorine ion implantation occured for all oxidation cycles and all energies and doses of chlorine. Enhancements of about 2% were found for low dose, low energy implants and enhancements as high as 95% were found for high dose, high energy, graded implants. Although the inventors do not wish to be limited by their theory, it is beleived that the higher enhancements are the result of availablity of chlorine throughout most of the oxidation cycle. The highest enhancement occured in the short oxidation cycle and probably is due to a greater proportion of the oxidation cycle occuring with chlorine present in the silicon. For longer oxidation cycles the chlorine may have diffused away from the silicon-oxide interface.

EXAMPLE 4

Single crystal silicon wafers were divided into two groups. The first group was thermally oxidized to form an oxide layer having a thickness of 20–25 nanometers and then a layer of silicon nitride having a thickness of about 100 nanometers was deposited over the thermal oxide. The second group of wafers was prepared by growing a thin layer of thermal nitride directly on the surface of the silicon and then depositing first a layer of silicon oxide and then a layer of silicon nitride. Each group of wafers was then photolithographically patterned and the oxide and nitride layers were etched to expose portions of the silicon substrates. The wafers from each group were then implanted with chlorine ions as follows: High dose graded implant consisting of $1 \times 10^{16}$cm$^{-2}$ at 160 kev plus $5 \times 10^{15}$cm$^{-2}$ at 65 kev; Low dose graded implant consisting of $5 \times 10^{15}$cm$^{-2}$ at 160 kev plus $2.5 \times 10^{15}$ cm$^{-2}$ at 65 kev: High energy single implant consisting of $1 \times 10^{16}$ cm$^{-2}$ at 160 kev; Low energy single implant consisting of $1 \times 10^{16}$ cm$^{-2}$ at 80 kev; and no implant. During each of the implant cycles a portion of each wafer was masked with photoresist so that portion of the wafer received no implant. After the implant, wafers from each of the processing groups were oxidized for either 82 minutes at 1000° C. in steam or for 270 minutes at 900° C. in steam. To produce approximately the same oxide thickness, the unimplanted samples were oxidized for either 158 minutes at 1000° C. in steam or for 480 minutes at 900° C. in steam. After oxidation, the wafers were evaluated both for oxide thickness and for lateral oxide growth. The evaluation for oxide thickness consisted of comparing the oxide thickness in the implanted and unimplanted regions of the wafer surface. Lateral oxide growth was evaluated by scanning electron microscope inspection of cross-sectioned wafers and measurement of the width of an active region (which had been protected by the overlying oxidation resistant material) and measurement of the width of an adjacent oxide region. In each case, the sum of the active line and the oxide space were approximately 4.5 micrometers. The results of the evaluation are tabulated in the following table.

| Group | Oxidation Temperature | Chlorine Implant | Oxide Thickness Enhancement | Active Line | Oxide Space |
|---|---|---|---|---|---|
| 1 | 900 | High dose graded | 1.71 | 3.62 | 0.91 |
| 1 | 900 | Low dose graded | 1.41 | 3.83 | 0.86 |
| 1 | 900 | High energy single | 1.47 | 3.86 | 1.03 |
| 1 | 900 | Low energy single | 1.44 | 3.55 | 0.92 |
| 1 | 900 | No implant | — | 3.21 | 1.60 |
| 1 | 1000 | High dose graded | 1.56 | 3.81 | 0.72 |
| 1 | 1000 | Low dose graded | 1.39 | 3.93 | 0.85 |
| 1 | 1000 | High energy single | 1.30 | 3.87 | 0.78 |
| 1 | 1000 | Low energy single | 1.32 | 3.95 | 0.85 |
| 1 | 1000 | No implant | — | 3.65 | 1.13 |
| 2 | 900 | High dose graded | 1.71 | 2.60 | 1.90 |
| 2 | 900 | Low dose graded | 1.44 | 2.78 | 1.68 |
| 2 | 900 | High energy single | 1.40 | 2.64 | 1.83 |
| 2 | 900 | Low energy single | 1.45 | 2.67 | 1.81 |
| 2 | 900 | No implant | — | 2.68 | 2.14 |

-continued

| Group | Oxidation Temperature | Chlorine Implant | Oxide Thickness Enhancement | Active Line | Oxide Space |
|---|---|---|---|---|---|
| 2 | 1000 | High dose graded | 1.48 | 2.80 | 1.72 |
| 2 | 1000 | Low dose graded | 1.41 | 2.77 | 1.68 |
| 2 | 1000 | High energy single | 1.36 | 3.05 | 1.73 |
| 2 | 1000 | Low energy single | 1.33 | 2.98 | 1.87 |
| 2 | 1000 | No implant | — | 2.52 | 2.19 |

Consistant with earlier results, enhancement in the oxide thickness of as much as 71% was observed. The greatest enhancement was found for high dose graded implants which were oxidized at the lower oxidation temperatures. Enhancement in the thickness of the oxide is found in all regions which received a chlorine implant as compared to those regions which did not receive a chlorine implant. In all variations, the active line is wider and the oxide space is narrower for the chlorine implanted samples than for the unimplanted samples. This illustrates that under all implant conditions and for either oxidation temperature the oxide growth rate is enhanced in the vertical direction with a chlorine implant; the increase in the oxide growth rate is greater in the vertical direction than in the lateral direction so that for a given oxide thickness the lateral encroachment is less for the implanted samples than for the unimplanted samples.

Thus it is apparent that there has been provided, in accordance with the invention, an improved process for forming isolation between devices which fully meets the objects and advantages set forth above. Although the invention has been described and illustrated by reference to specific embodiments thereof, it is not intended that the invention be limited to these illustrative embodiments. Those skilled in the art will recognize that modifications and variations can be made without departing from the spirit of the invention. For example, other oxidation resistant layers, other oxidation conditions and ambients, and other device structures utilizing oxide isolation can be used. Accordingly, it is intended to encompass within the invention all such modifications and variations as fall within the scope of the appended claims.

We claim:

1. An improved process for selectively anisotropically oxidizing a silicon substrate to provide localized oxide isolation of reduced width wherein the improvement comprises the step of:
    before heating in an oxidizing ambient, selectively implanting chlorine atoms into localized regions of said substrate comprising less than the whole of said substrate where said oxide isolation is desired, to increase growth rate of said oxide in a vertical direction relative to growth rate in a lateral direction.

2. The improved process of claim 1 wherein said substrate is coated with a layer of oxidation resistant material; said layer is patterned with photoresist; and said layer and said photoresist are used as an implantation mask in said step of selectively implanting.

3. The improved process of claim 1 wherein said step of selectively implanting includes implanting at more than one implant energy.

4. The improved process of claim 1 wherein said substrate having a chlorine implant is oxidized at a temperature of about 1000° C. or less.

5. The improved process of claim 3 wherein said implanting at more than one implant energy comprises implanting at three different energies.

6. In a process for increasing the vertical oxide growth rate and for reducing the width of oxide used for isolating betwen devices in a silicon substrate wherein an oxidation masking layer is formed overlying said substrate, said layer is patterned to form openings therethrough, and said substrate is oxidized using the remainder of said layer as an oxidation mask, the improvement comprising:
    selectively implanting halogen ions into said substrate through said openings prior to oxidizing said substrate to anisotropically increase oxide growth rate.

7. The process of claim 6 wherein said halogen ions comprise chlorine ions.

8. The process of claim 6 wherein said step of selectively implanting comprises implanting at a plurality of implant energies.

9. A process for fabricating a semiconductor device including localized regions of oxide isolation thermally grown at the surface thereof wherein the rate of vertical growth of said oxide isolation is increased relative to the lateral growth rate of said oxide isolation which comprises the steps of:
    providing a silicon substrate having a surface;
    forming a layer of oxidation resistant material overlying said surface;
    patterning said material to expose portions of said surface,
    said portions comprising less than the whole of said surface;
    implanting halogen ions into said portions which are exposed;
    and heating said substrate in an oxidizing ambient to anisotropically oxidize said portions which are exposed to form oxide isolation having a reduced width.

10. The process of claim 9 wherein said step of implanting comprises implanting chlorine ions.

11. The process of claim 9 wherein said step of heating comprises heating in a steam ambient.

12. The process of claim 10 wherein said step of implanting chlorine ions comprises implanting at a plurality of implant energies.

13. The process of claim 10 wherein said step of heating comprises heating to a temperature of about 830°–1000° C.

* * * * *